US 6,587,378 B2

(12) United States Patent
Hassan et al.

(10) Patent No.: US 6,587,378 B2
(45) Date of Patent: Jul. 1, 2003

(54) APPARATUS AND METHOD FOR REFRESHING A FLASH MEMORY UNIT

(75) Inventors: Mohammed A. Hassan, Sugar Land, TX (US); Robert M. Crosby, Sugar Land, TX (US); Clyde F. Dunn, Sugar Land, TX (US); Andrew M. Love, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/021,824

(22) Filed: Dec. 13, 2001

(65) Prior Publication Data

US 2002/0110028 A1 Aug. 15, 2002

Related U.S. Application Data

(60) Provisional application No. 60/255,270, filed on Dec. 13, 2000.

(51) Int. Cl.$^7$ ................................................ G11C 16/06
(52) U.S. Cl. .............................. 365/185.2; 365/185.18; 365/185.21; 365/185.25
(58) Field of Search .................. 365/185.25, 185.2, 365/185.21, 185.18, 201

(56) References Cited

U.S. PATENT DOCUMENTS 6,282,120 B1 * 8/2001 Cernea et al. ........... 365/185.2
6,411,549 B1 * 6/2002 Pathak et al. .......... 365/185.21

* cited by examiner

Primary Examiner—Huan Hoang
(74) Attorney, Agent, or Firm—William W. Holloway; W. James Brady; Frederick J. Telecky, Jr.

(57) ABSTRACT

In a Flash memory unit, the storage of a logic signal in the memory cells is determined by performing a READ operation. The NORMAL READ operation requires that the floating gate store an amount of charge $Q_{NR}$ above which a logic "0" is identified and below which a logic "1" is identified as being stored in the memory cell. A second level of charge $Q_{TR}$ stored on the floating gate is used in a TEST READ operation. The stored charge $Q_{TR}$ is greater than the stored charge $Q_{NR}$, but less than the charge stored on the floating gate as the result of a WRITE operation. The result of a TEST READ operation is compared with a NORMAL READ operation of a memory cell. When the logic state identified by the TEST READ operation and the NORMAL READ operation are not the same, the charge on the cell is determined to have decayed below a prescribed level and the memory cell is refreshed to the level that is present during a WRITE operation.

14 Claims, 4 Drawing Sheets

APPARATUS AND METHOD FOR REFRESHING A FLASH MEMORY UNIT

This application claims the benefit of U.S. Provisional Application No. 60/255,270, filed Dec. 13, 2000.

BACKGROUND OF THE INVENTION

1. Field of the Invention

This invention relates generally to data processing systems and, more particularly, to the memory units in data processing systems used to store logic bits. More specifically, the present invention relates to the operation of a semiconductor memory generally referred to as a Flash memory or Flash memory unit.

2. Background of the Invention

The Flash memory units have received wide application in electronic devices as a non-volatile memory. The heretofore most common memory unit was a random access memory (RAM) unit. The RAM memory units are volatile and must be refreshed periodically. In addition, the RAM memory unit must be reloaded after each shut-down of the memory unit. In contradistinction, A Flash memory unit retains the information during device shut-down and does not have to be reloaded.

Referring to FIG. 1, a cross-sectional view of a Flash memory cell 10 is shown. The Flash memory cell 10 includes a substrate (well) region 11 in which a source electrode 12 and a drain electrode 14 are formed. The source electrode 12 and the drain electrode 14 are separated by a channel region 15. Opposite the channel region 15 and separated from the channel region 15 by a tunnel oxide layer 18 is a polysilicon floating gate 17. A polysilicon control gate 17 is separated from the floating gate 17 by an inter-polysilicon dielectric layer 19. Bias voltages can be applied to the well (substrate) 11, to the source electrode 12, to the drain electrode 14, and to the control gate 17.

The Flash memory cell 10 can be biased to function as a memory cell in the following manner. When the source electrode 12 is biased to 0 potential, the well region 11 is biased to 0 potential, the drain electrode 14 is biased to an intermediate voltage, and the control gate is biased to a high potential, then electrons migrate to and are stored on the floating gate 16. The storage of electrons on the floating electrode 16 provides the write operation for the Flash memory cell 10 that can be considered a representation of the stored logic state. When the source electrode 12 and the well region 11 are biased to 0 potential, the drain is electrode 14 is biased to a small potential, and the control gate 17 is biased to approximately the intermediate potential, stored charge on the floating electrode 16 controls the current through the channel and the "logic state" of the device can be determined. When the source electrode 12 and the drain electrode 14 are allowed to "float", a negative high voltage is applied to the control gate 17, and the well is biased to a positive high potential, the "logic state" of the Flash cell 10 is erased. That is, any charge stored on the floating gate will be removed. According to one embodiment, the presence of charge stored on the floating gate 16 is defined as a "logic 0 state" and the absence of charge stored on the floating gate is defined as a "logic 1 state". (As will be clear to those skilled in the art of Flash memory units, the erase operation can be somewhat more complex and can involve at least one "compact" operation. The "compact" operation is not necessary to the understanding of the present invention.)

While using present technology, the non-volatile nature of the present invention can be understood as a relative term. Over long periods of time, the charge on the floating gate 16 can be lost. The mechanisms for the loss of charge can include thermal migration, process irregularities, environmental conditions, etc. Therefore, when the logic signals stored in a Flash memory unit are unchanged for long periods of time, the "logic state" stored in the Flash memory unit can eventually be compromised.

A need has therefore been felt for apparatus and an associated method having the feature that the integrity of the logic signals stored in a Flash memory unit can be tested. It is another feature of the present invention that the integrity of the logic signals stored in a Flash memory unit is automatically stored during initiation of the operation. It is yet a further feature of the present invention to determine the integrity of a flash memory unit for an intermediate charge level on each cell between the originally stored charge level and the charge level required to establish the logic state of a memory cell. It is a still further feature of the present invention, when the integrity test for an intermediate cell charge logic state fails, to test the integrity of the Flash memory cells for typical read conditions. It is yet another feature of the present invention, when test for the intermediate Flash memory cell logic state and the test for logic state under typical read conditions is successful, to refresh the charge on the Flash memory cell that failed the intermediate charge level logic signal integrity test. It is a still further feature of the present invention to abort the use of the Flash memory cells that fail the typical read condition logic signal test.

SUMMARY OF THE INVENTION

The aforementioned and other features can be accomplished, according to the present invention, by providing the Flash memory cell with a test condition in which a logic 0 can be read from the Flash test cell only when the charge stored on the floating gate is greater than that normally required to read a logic "0" and the amount of charge is less than the amount of charge stored on the gate stored during a write logic "0" operation. In this manner, a determination can be made whether the charge on the Flash memory cell has decayed beyond a preselected amount. When the charge has decayed below the preselected amount on a Flash memory cell floating gate, the charge on the floating gate is refreshed. In practice, the entire Flash memory is accessed in the test mode of operation and a test (read) checksum is calculated. When the test (read) checksum verifies the integrity of the contents of the Flash memory unit, no further action is necessary. When the checksum does not verify the integrity of the contents of the Flash memory unit, a normal (read) checksum is performed. When the normal checksum does not verify the contents of the Flash memory unit, then the activity is aborted. When the normal (read) checksum verifies the integrity of the contents of the Flash memory unit, then the result of a normal read and a test read from each cell are compared. When the test and normal read of a Flash memory cell provide the same result. When the test and the normal read of a Flash memory cell are different, the cell is then refreshed, i.e., the stored charge is once again written on the floating gate of the Flash memory cell. In this manner, a margin of safety can be obtained for the Flash memory unit.

BRIEF DESCRIPTION OF THE DRAWINGS

FIG. 2A illustrates a portion of an array of Flash memory cells forming a Flash memory unit, while

DESCRIPTION OF THE PREFERRED EMBODIMENTS

1 Detailed Description of the Figures

Figure 1:
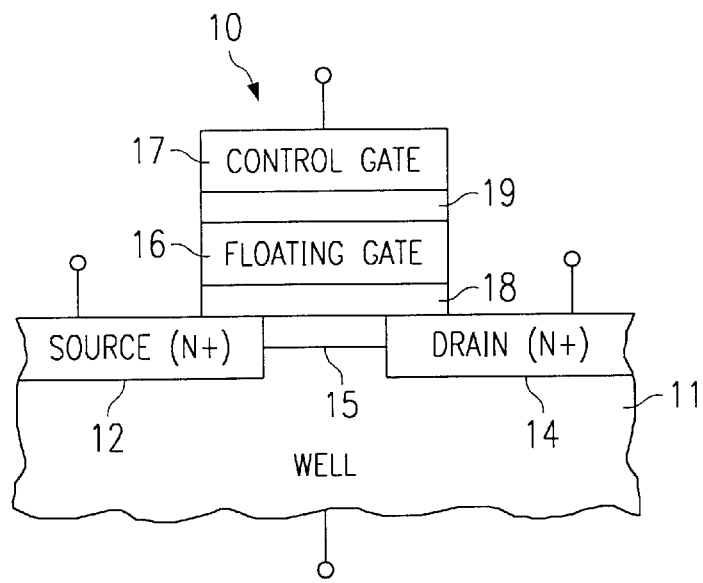
FIG. 1 is a cross-sectional diagram of a cell of a Flash memory unit according to the prior art.

FIG. 1 has been described in the Background of the Invention.

Figure 2A:
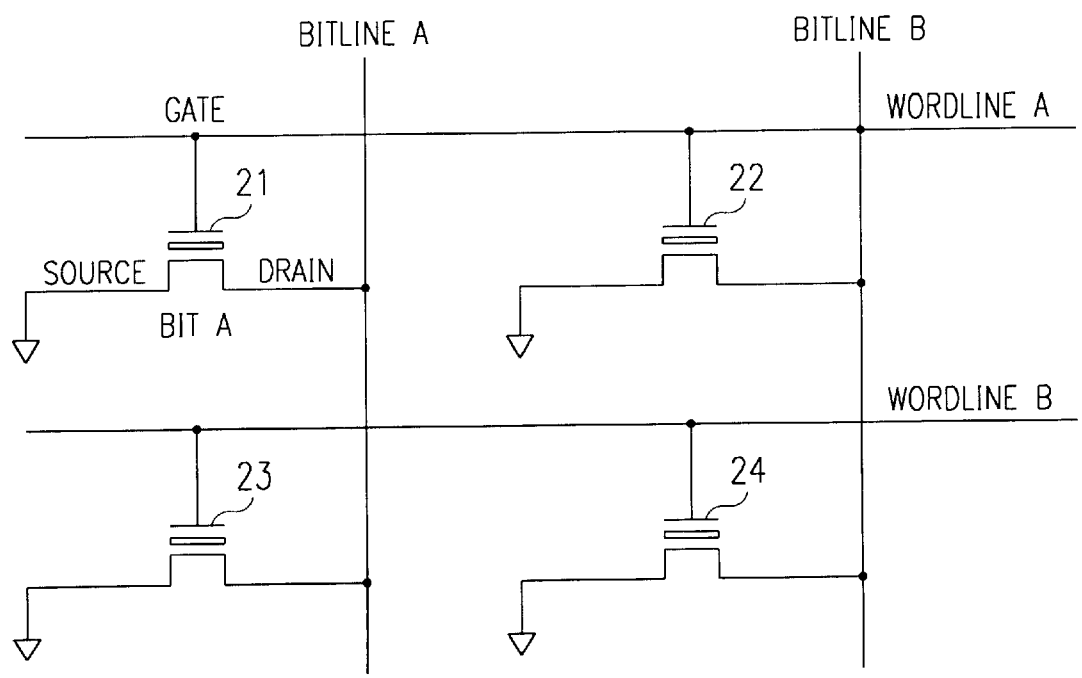

Referring to FIG. 2A, a portion of an array of Flash memory cells is shown. Flash memory cells 21 and 22 have gate terminals coupled to Wordline A, while Flash memory cells 23 and 24 have gate terminals coupled to the Wordline B. Flash memory cells 21 and 23 have drain terminals coupled to Bitline A, while Flash memory cells 22 and 24 have gate terminals coupled to Bitline B. The read operation is accomplished for a particular Flash memory cell by applying a positive voltage to one of the Wordlines lines and a positive voltage one of the Bitlines. The Flash memory cell at the Wordline/Bitline intersection will provide current to the coupled Bitline. The amount of current flowing to the coupled Bitline is determined by the charge on the floating gate of Flash memory cell 21. Therefore, the current in the Bitline is indicative of the logic state, i.e., a logic "1" or a logic "0" stored in the Flash memory cell. For example, when a positive voltage is applied to Wordline A and a positive voltage is applied to Bitline A, current will flow through the Flash memory cell 21. Because only one Wordline is activated, the charge flowing through Flash memory cell 21 (and no other charge) is applied to the coupled Bitline A. The number of electrons trapped on the floating gate of Flash memory cell determines how much charge flows through the Flash memory cell and through Bitline A. For a logic "0" for which in the preferred embodiment charge is trapped on the floating gate, the charge flowing through the Flash memory cell 21 will be less than the flow of charge through the Flash memory cell when substantially no free electrons are stored on the floating gate. When the charge flowing through the Bitline A is greater than the preselected amount, the Flash memory cell is determined to store a logic "1". Otherwise, the state stored in the flash memory unit is determined to be a logic "0".

Figure 2B:
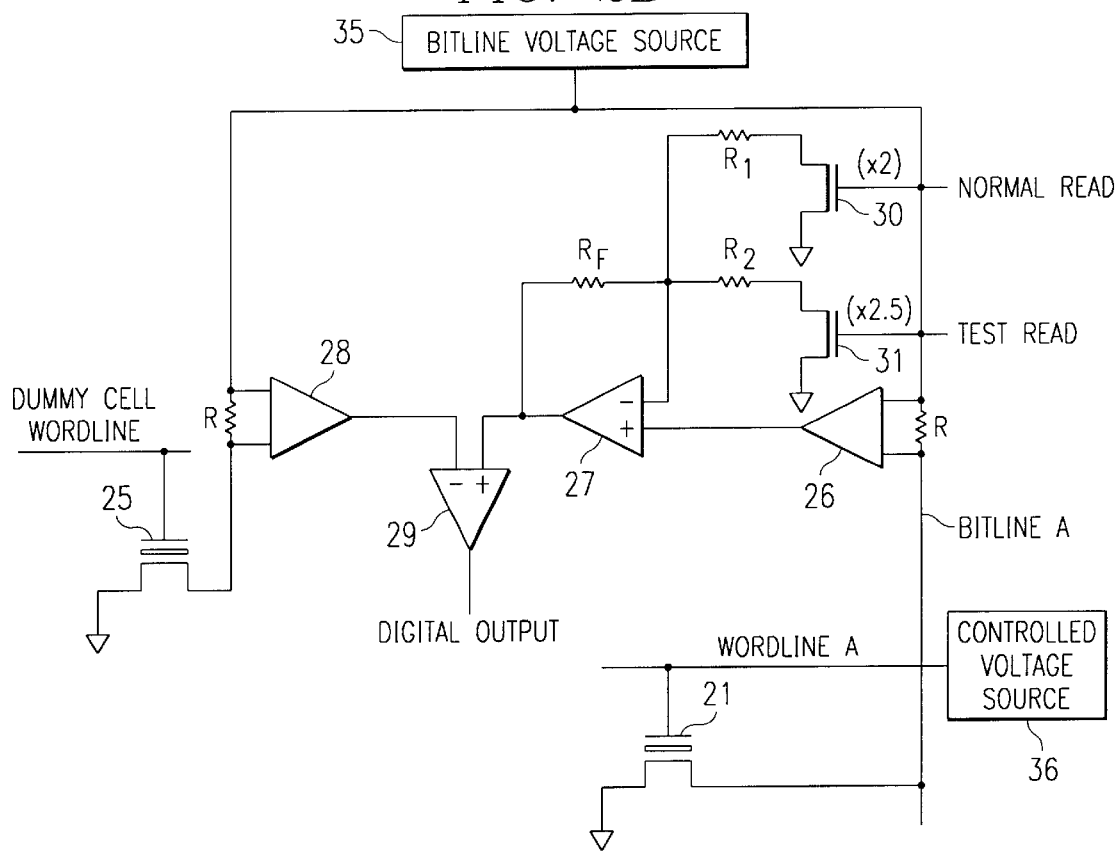
FIG. 2B illustrates the circuit for determining the logic state stored on a Flash memory cell from the current flowing through the cell.

Referring to FIG. 2B, the circuit for identifying the logic state stored in the Flash memory cell by the current in the Bitline is illustrated. The drain of Flash memory cell 21 is coupled to Bitline A. When a positive voltage is applied to Wordline A (i.e., by Controlled Voltage Source 36) and positive voltage is applied to the Bitline (i.e., by the Bitline Voltage Source 35), a current will flow through the Bitline and, consequently through resistor R. Then voltage resulting from the current flowing through the resistor R is applied to the input terminals of current-to-voltage amplifier 26. The voltage on the output terminal of the current-to-voltage amplifier 26 is applied to a first input terminal of operational amplifier 27. The output terminal of operation amplifier 27 is applied to a first input terminal of comparator 29 and to one terminal of resistor $R_F$. The second terminal of resistor $R_F$ is applied through resistor $R_1$ to a drain terminal transistor 30 and is applied through resistor $R_2$ to a drain terminal of transistor 31. The source terminals of transistors 30 and 31 are coupled to a common potential. A NORMAL READ signal can be applied to the gate terminal of transistor 30 and a TEST READ signal is applied to the gate terminal of transistor 31. The gate of a dummy Flash memory cell 25 has a dummy cell Wordline coupled thereto. The drain of the dummy cell 25 is coupled through resistor R to the Bitline Voltage source 35. When a positive voltage is applied to the Dummy Wordline and the Bitline Voltage Source 35, current will flow through the dummy cell 25 and through resistor R. The voltage developed as a result of current flowing through resistor R is applied to input terminals of current-to-voltage amplifier 28. The output terminal of current-to-voltage amplifier is applied to a second input terminal of comparator 29.

The operation of FIG. 2B can be understood as follows. Voltages are applied to the Wordline A, the Dummy Wordline and voltage from the Bitline Voltage source 35 is applied to the drain terminals of the Flash memory cell 21 and the dummy cell 25. Both the Flash memory cell 21 and the dummy cell 25 begin conducting current. A NORMAL READ signal is applied to the gate of transistor 30. The presence of the NORMAL READ signal causes the voltage at the output of current-to-voltage amplifier 26 to be multiplied by a factor of two i.e., indicated by the (×2). The dummy cell typically has no charge stored thereon (the charge is uv erased in the preferred embodiment). Thus, when the dummy cell 25 and the Flash memory cell 21 have approximately similar characteristics and applied voltages, the digital output of the comparator 29 will indicate a positive voltage level, i.e., a logic "1" state, until the current from the Flash memory cell 21 is one half the current from the dummy cell. That is, the charge on the Flash memory cell 21 will be interpreted as a logic "1" until the charge stored on the floating gate reduces the current to less than one half the value of the current from the dummy cell 25. Then, the charge on the floating gate of the Flash memory cell will be interpreted as a logic "0". The use of the TEST READ signal, with a factor of (×2.5) associated therewith, will become apparent with the description of the invention given below.

Figure 3:
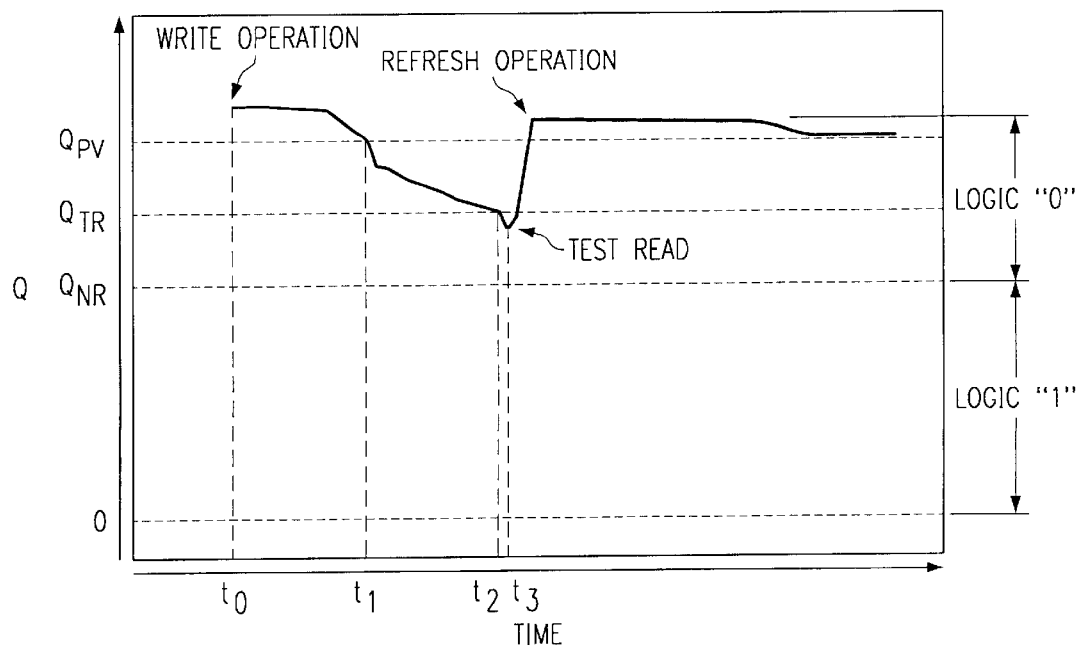
FIG. 3 illustrates the charge stored in the FLASH memory cell corresponding to a PROGRAM VERIFY condition, a READ MARGIN condition, a normal READ 0 condition, and a READ 1 condition according to the present invention.

Referring to FIG. 3, a Flash memory cell has four regions of stored charge Q according to the present invention. The stored charge region above the charge labeled $Q_{PV}$ indicates the minimum amount of charge that is stored in the floating gate of the Flash memory unit during a WRITE (logic "0") operation. When a PROGRAM VERIFY READ operation is performed immediately after a WRITE operation, the Flash memory cell should respond as if an amount of charge greater than $Q_{PV}$ were present on the floating gate. When this amount of charge is not detected, either the WRITE operation or the cell itself is defective. A second stored charge amount is labeled $Q_{TR}$. When a TEST READ operation is performed on the Flash memory cell, a logic "0" will be identified when the charge on the floating gate is greater than the $Q_{PV}$. When a NORMAL READ operation is performed on the Flash memory cell, a logic "0" will be identified when the stored charge on the floating gate of the Flash memory cell is greater than $Q_{NR}$. For any READ operation, when the charge on the floating gate is less that $Q_{NR}$, a logic "1" will be identified as being stored in the Flash memory cell. Ideally, the charge stored on the floating gate is 0 when a logic "1" is stored in the cell.

Referring once again to FIG. 3, a WRITE operation applies a charge greater than $Q_{PV}$ to a Flash memory cell at time $t_0$. Over time, the charge on the floating gate decays. At time $t_1$, the amount of charge passes through the $Q_{PV}$ charge, i.e., the amount of charge necessary for a successful WRITE operation. At time $t_2$, the amount of charge on the floating gate drops below $Q_{TR}$, i.e., the amount of charge necessary for the logic "0" to be identified during a TEST READ operation. At time $t_3$, a TEST READ operation is performed. When the TEST READ operation determines that the amount of charge on the Flash memory unit floating gate has fallen below a predetermined amount, a REFRESH operation is performed in which the charge on the floating gate is once again above the $Q_{PV}$ amount.

Figure 4:
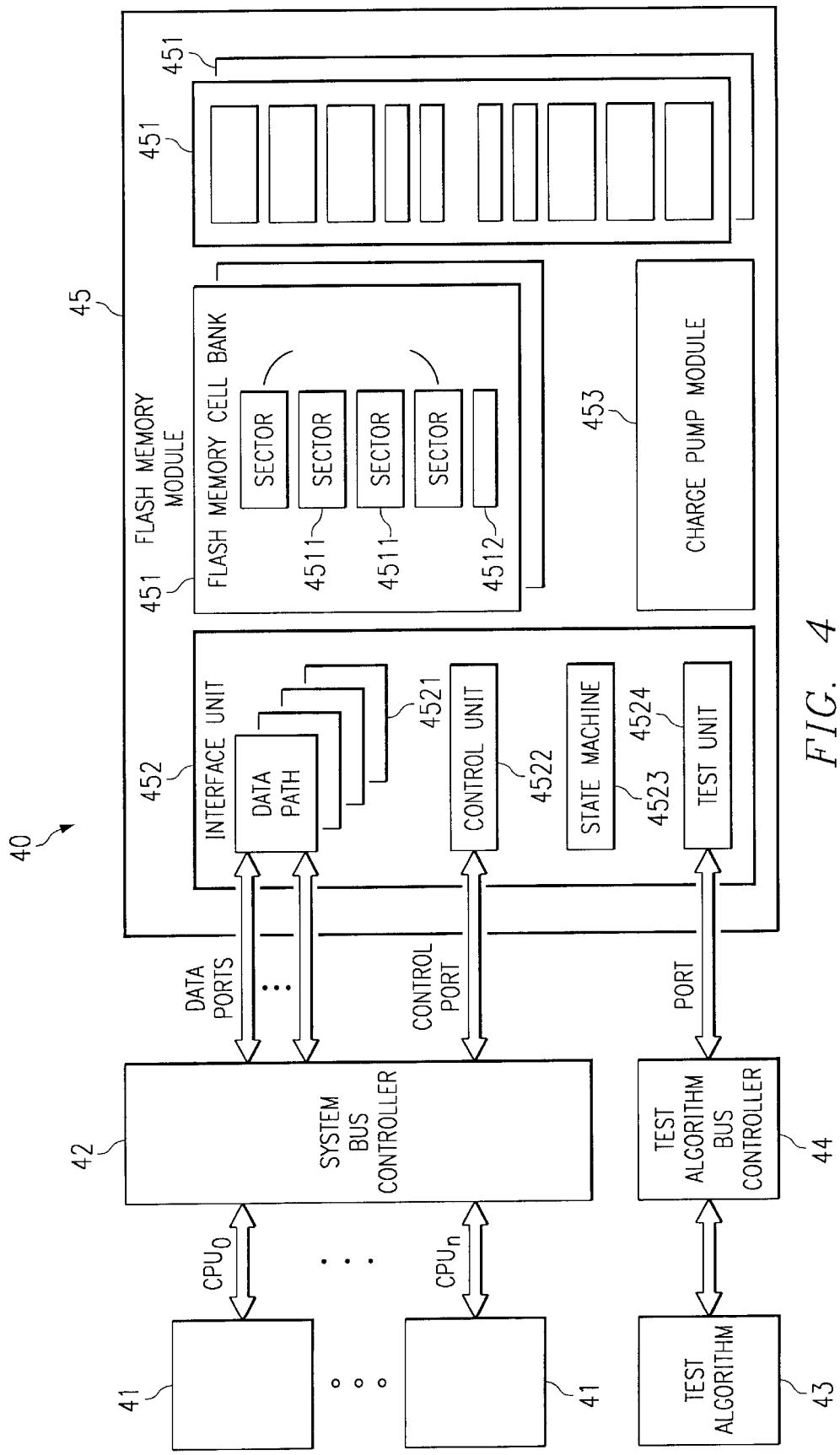
FIG. 4 is a block diagram of the Flash memory unit and associated apparatus according to the present invention.

Referring to FIG. 4, a block diagram of the data processing system 40 including a Flash memory module 45 is shown. The Flash memory module 45 includes a plurality of Flash memory cell banks 451. The Flash memory cells in each Flash memory cell bank 451 are arranged in sectors 4511. The Flash memory cell bank also includes at least one OTP sector 4512. The OTP sector unit 4512 is a write-memory unit that can be used to provide a device identification number and/or security information. The Flash memory cell module 45, in addition at least one Flash memory cell bank 451, includes a charge pump module 453 and an interface unit 452. The charge pump module 453 provides the voltage levels for the Flash memory cell banks 451. The interface unit 452 includes data path components 4521 for distributing and collecting signal bits, a control unit 4522 for controlling the operation of the Flash memory module 45, a state machine 4523 for determining the state of the Flash memory module 45, and a test unit 4524 for controlling the distribution of the signals resulting in the testing of the Flash memory cells. Coupled to the Flash memory module 45 are a system bus controller 42 and a test algorithm bus controller. The system bus controller 42 controls the exchange of signals between at least one central processing unit (CPU) 41 and the data path components 4521 and the control unit 4522. The test algorithm bus controller 44 controls the exchange of signals between the device storing the test algorithm 43 and the test unit.

Figure 5:
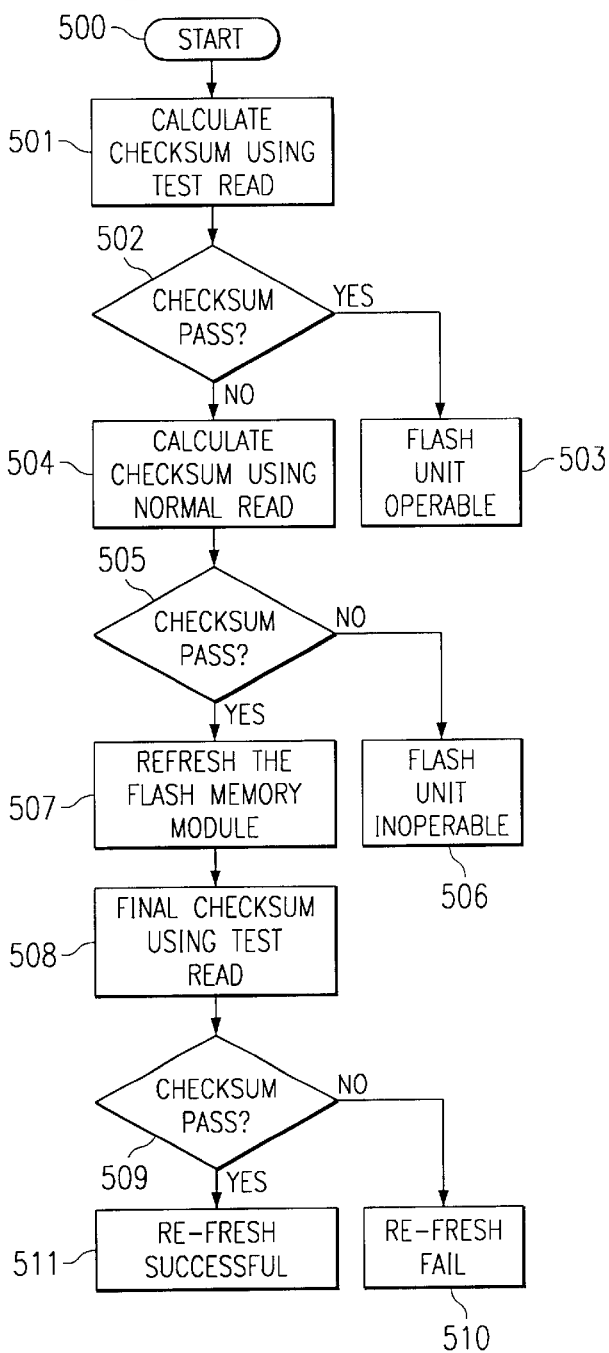
FIG. 5 illustrates the general procedure for testing the integrity of the storage of information of a Flash memory module according to the present invention.

Referring to FIG. 5, the technique for testing the Flash memory unit is summarized. The process is initiated in step 500. Typically, the activation of the processing system 40 will result in execution of the test procedure. However, the test procedure can be initiated by other system events, such as the expiration of a clock or identification of an error in a result involving the contents of the Flash memory unit. In step 501, a series of TEST READ operations is performed on the contents of the Flash memory module. Using the results of the TEST READ operations, the checksum is calculated for the Flash memory unit. In step 502, the calculated checksum is compared with the expected checksum. When the checksum is equal to the expected value in step 502, the operation of the Flash memory unit is verified and the operation of the central processing unit can continue in step 503. When the checksum is not equal to the expected value in step 502, then, in step 504, a NORMAL READ operation is performed on the cells of the Flash memory unit and a checksum is determined. In step 505, the checksum determined by the NORMAL READ operation is compared with the expected checksum result. When the result of the comparison is negative, then the control unit of the Flash memory module is notified that an error has occurred in the Flash memory module. When the comparison is positive in step 505, then the Flash memory module is refreshed, i.e., charge is applied to Flash memory cell to insure that the charge stored on the floating gates are above $Q_{TR}$. Then, in step 508, using a TEST READ operation for the cells of the Flash memory unit, a final checksum is calculated in step 508. In step 509, the checksum calculated and a result of step 508 is compared with the expected result. When the comparison in step 509 is negative, the REFRESH operation has failed and the control unit is notified in step 510. When the comparison in step 509 is positive, then the REFRESH operation is successful and the processing unit can continue operation in step 511.

Figure 6:
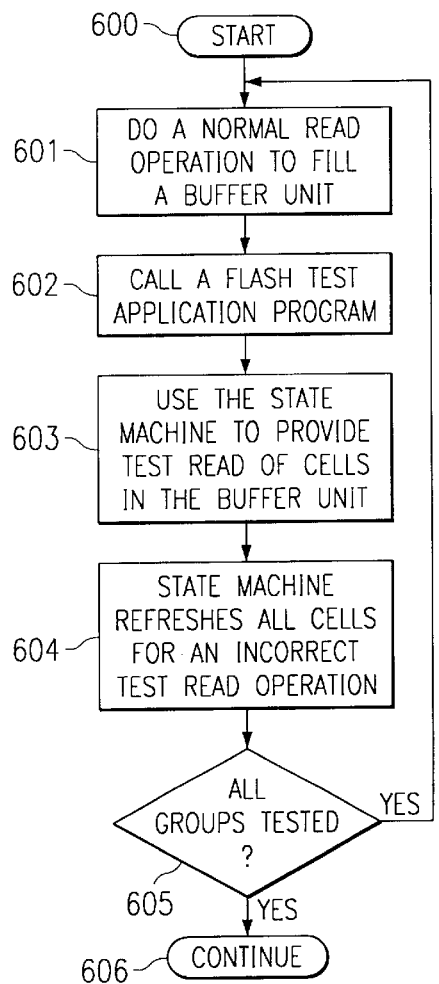
FIG. 6 is the flow diagram of the REFRESH operation.

Referring to FIG. 6, the subroutine describing the REFRESH operation is shown. The routine is started in step 600. In step 601, a NORMAL READ operation is used to fill a buffer unit with the logic states stored in a group (e.g., word) of Flash memory cells. In step 602, a Flash test application is called and is used to program the state machine. The state machine then provides a TEST READ operation for the Flash memory cells for which the states have been stored in the buffer unit in step 603. When the TEST READ operation does not provide the same logic state as is stored in the buffer unit, then, in step 604, the state machine refreshes the cell providing the incorrect TEST READ operation result. In the preferred embodiment, the REFRESH operation is performed by the application of a series of pulses to the identified cell until the cell passes a PROGRAM VERIFY operation. In step 605, a determination is made whether all of the Flash memory cells have been tested. If all the cells have been tested, operations involving the Flash memory unit proceed in step 606. If all of the memory cells have not been tested, then the process returns to step 601 wherein the logic states or another group of memory cells are stored in the buffer unit.

2. Operation of the Preferred Embodiments

The purpose of the invention is to ensure that the charge on the floating gate is at least a preselected amount above the minimum amount of charge necessary to provide a logic "0" when the cell is subjected to a NORMAL READ operation. To accomplish this, the checksum, resulting from reading the Flash memory cells using the TEST READ operation, is calculated. When the checksum resulting from TEST READ operations is the same as the expected checksum for the memory unit, the result is interpreted that the cells of the Flash memory unit have an amount of charge stored on the floating gates with an acceptable margin of error. When the checksum resulting from the TEST READ operation does not produce the expected result, then a TEST READ operation is compared with a NORMAL READ operation. For those memory cells where the comparison is not found, these memory cells are refreshed, i.e., the charge is increased to the level that would normally result from a WRITE operation. In this manner, a margin of error can be maintained for the stored charge on the floating gate of all of the cells in the Flash memory unit.

While the TEST READ operation can be performed at any time to ensure satisfactory operation of the Flash memory unit, in the preferred embodiment, the TEST READ operation is automatically on initiation of activity of the processing unit. A failure of the checksum resulting from a NORMAL READ operation is reported to the system as it may indicate an unrecoverable error. As will be clear, the integrity of the system can be enhanced by the use of error detection and correction techniques. However, these techniques require additional apparatus and can impact the performance of the memory unit.

As indicated above in FIG. 2B, the charge level on the Flash memory cell that can be interpreted, by the output of the differential amplifier as dividing a logic "0" state and a logice "1" state can be controlled, e.g., by the state machine. Thus, the present invention can determine whether the charge on the floating is $Q_{NR}$ (NORMAL READ), $Q_{TR}$ (TEST READ) or $Q_{PV}$ (PROGRAM VERIFY)

One important feature of the present invention can be understood by referring once again to FIG. 2B. Whether a NORMAL READ operation or a TEST READ operation is being performed on the Flash memory cell 21, the voltage applied to the gate terminal is the same. Because the voltage applied to the gate is the same for either operation, less opportunity is present to inadvertently disturb the charge stored on the floating gate of Flash memory cell 21.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. A Flash memory unit comprising:
   a plurality of Flash memory cells, each Flash memory cell including a source, a drain, a well, a floating gate, and a control gate,
   a dummy Flash memory cell, each dummy Flash memory cell including a source, a drain, a well, a floating gate, and a control gate,
   a comparison circuit for comparing the current through the dummy Flash memory cell with the current through one of the Flash memory cells, and a control circuit for controlling when the current through the Flash memory cell represents a predetermined amount of charge stored on the floating gate of the Flash memory cell;
   wherein one amount of charge defines the logic states for a NORMAL READ operation and a larger second amount of charge amount defines the logic states for a TEST READ operation.

2. The Flash memory unit as recited in claim 1 wherein a third amount of charge, larger than the second charge amount, defines the logic states for an amount of charge stored on the floating gate as a result of a WRITE operation.

3. A Flash memory unit comprising:
   a plurality of Flash memory cells, each Flash memory cell including a source, a drain, a well, a floating gate, and a control gate,
   a dummy Flash memory cell, each dummy Flash memory cell including a source, a drain, a well, a floating gate, and a control gate,
   a comparison circuit for comparing the current through the dummy Flash memory cell with the current through one of the Flash memory cells,
   a control circuit for controlling when the current through the Flash memory cell represents a predetermined amount of charge stored on the floating gate of the Flash memory cell; and
   a state machine, the state machine controlling the control circuit, the control circuit thereby determining the identification of a logic state identified by a NORMAL READ operation and the logic state identified by a TEST READ operation.

4. The Flash memory unit as recited in claim 3 wherein, when the logic state for a Flash memory cell determined by a TEST READ operation is different from the logic state for the same cell determined by a NORMAL READ operation, the state machine refreshes the charge stored on the floating gate of the Flash memory cell.

5. A method of providing a charge margin for the cells of a Flash memory unit, the method comprising:
   adding charge to a Flash memory cell when the charge stored on the floating gate of a memory cell is less than a predetermined amount; and
   defining a logic state determined by a first charge for a NORMAL READ operation, defining a logic state determined by a second charge greater than the first charge for a TEST READ operation.

6. The method as recited in claim 5 further comprising determining a presence of at least the first charge and a presence of at least the second charge by comparing the current through the Flash memory cell with the current through a dummy Flash memory cell.

7. The method as recited in claim 5 wherein the comparing step is implemented with the same voltages being applied to the Flash memory cell during the NORMAL READ operation and the TEST READ operation.

8. The method as recited in claim 7 further comprising, after using a series of TEST READ operations for all the memory cells of the memory unit, computing a checksum to determine whether further refreshing of cells in the Flash memory unit is necessary.

9. The method as recited in claim 5 further comprising implementing a WRITE operation that results in a stored charge greater than a third stored charge, the third stored charge being greater than the second stored charge.

10. A Flash memory cell unit comprising:
    a plurality Flash memory cells,
    at least one dummy Flash memory cell, and
    a comparison circuit for comparing the current flowing through a selected Flash memory cell and the dummy Flash memory cell, comparison circuit determining a first logic state for the selected Flash memory cell during a NORMAL READ operation when a charge stored on the floating gate is greater that a first charge amount, the comparison circuit determining the first logic state for a TEST READ operation when the charge stored on the floating gate is greater than a second charge amount, the second charge amount being greater than the first charge amount.

11. The Flash memory unit as recited in claim 10 wherein, when the first logic state is identified in the NORMAL READ operation but not in the TEST READ operation, the charge stored on the floating gate of the selected Flash memory cell has decayed by an unacceptable amount.

12. The Flash memory unit as recited in claim 11 wherein a TEST READ operation is performed on all of the Flash memory cells as part of test checksum calculation.

13. Apparatus for testing a Flash memory cell, the apparatus comprising:
    a dummy memory cell;
    a component for generating a first voltage proportional to current through the dummy cell;
    a component for generating a second voltage proportional to the current through the Flash memory cell, wherein the factor of proportionality between the second voltage and the current through the Flash memory cell is controllable; and
    voltage supply units for activating the dummy cell and the Flash memory cell;
    wherein a first factor of proportionality tests the Flash memory cell for a NORMAL READ operation, and wherein a second factor of proportionality tests the Flash memory unit for a TEST READ operation.

14. The apparatus as recited in claim 13 wherein the activation parameters for the Flash memory cell during the TEST READ operation are the same as the parameters during the NORMAL READ operation.

* * * * *